United States Patent
Wang et al.

(10) Patent No.: US 8,154,945 B2
(45) Date of Patent: Apr. 10, 2012

(54) DECODING CIRCUIT WITHSTANDING HIGH VOLTAGE VIA LOW-VOLTAGE MOS TRANSISTOR AND THE IMPLEMENTING METHOD THEREOF

(75) Inventors: Nan Wang, Shanghai (CN); Guoyou Feng, Zhejiang (CN)

(73) Assignee: Shanghai Hua Hong NEC Electronics Company, Ltd., Shanghai (CN)

( * ) Notice: Subject to any disclaimer, the term of this patent is extended or adjusted under 35 U.S.C. 154(b) by 248 days.

(21) Appl. No.: 12/505,591

(22) Filed: Jul. 20, 2009

(65) Prior Publication Data
US 2010/0014376 A1  Jan. 21, 2010

(30) Foreign Application Priority Data
Jul. 21, 2008 (CN) .......................... 2008 1 0043652

(51) Int. Cl.
*G11C 8/00* (2006.01)
*H03K 19/084* (2006.01)
(52) U.S. Cl. ............... 365/230.06; 365/185.23; 326/108
(58) Field of Classification Search ............. 365/230.06, 365/185.23, 185.27, 189.11, 189.16, 189.14; 326/108
See application file for complete search history.

(56) References Cited

U.S. PATENT DOCUMENTS

| | | | |
|---|---|---|---|
| 4,750,078 A | 6/1988 | Ganger et al. | |
| 5,661,683 A | 8/1997 | Song | |
| 5,668,758 A * | 9/1997 | Yiu et al. | 365/185.23 |
| 6,023,188 A | 2/2000 | Lee et al. | |
| 2007/0268774 A1* | 11/2007 | Lee et al. | 365/230.06 |

OTHER PUBLICATIONS

Garner, et al, Indirect fluorescence detection of sugars separated by capillary zone electrophoresis with visible laser excitation, Journal of Chromatography, 1990, p. 639-644.
Mokuno, et al, Formation of hydrogenated amorphous carbon films by plasma based ion implantation system applying RF and negative high voltage pulses through single feedthrough.

* cited by examiner

*Primary Examiner* — Alexander Sofocleous
*Assistant Examiner* — Hai Pham
(74) *Attorney, Agent, or Firm* — Ming Chow; Sinorica, LLC

(57) ABSTRACT

The present invention discloses a decoding circuit withstanding high voltage via a low-voltage MOS transistor, where negative high voltage that can be withstood can be as high as double what the transistor itself can withstand via two-stage CMOS inverters connected serially. When the negative high voltage is withstood, the source of a PMOS transistor in the CMOS inverter is switched to high resistance, and the substrate to the ground; the source of an NMOS transistor in the first CMOS inverter is connected with a half negative high voltage, and the source of an NMOS transistor in the second CMOS inverter with a negative high voltage; the first CMOS inverter, whose output is the half negative high voltage, is grounded at its input terminal, and output of the second CMOS inverter is the negative high voltage. The present invention further discloses a method of implementing the decoding circuit and a memory circuit using the decoding circuit. The present invention can effectively reduce area the device occupies; it is applicable to the non-volatile memory field, realizing high-voltage output during a high-voltage operation and fast decoding output during a normal-voltage operation.

6 Claims, 3 Drawing Sheets
DECODING CIRCUIT WITHSTANDING HIGH VOLTAGE VIA LOW-VOLTAGE MOS TRANSISTOR AND THE IMPLEMENTING METHOD THEREOF

TECHNICAL FIELD

The present invention relates to the field of the non-volatile memory in the semiconductor integrated circuit, especially to a decoding circuit withstanding a high voltage via a low-voltage MOS transistor; the present invention further relates to a method of implementing the decoding circuit and a memory circuit using the decoding circuit.

BACKGROUND TECHNOLOGY

For a word line decoding circuit of such a non-volatile memory as Flash and EEPROM, high-voltage output is required in erasion or programming modes, while fast decoding output in read mode. FIG. 1 is an architecture block diagram of a memory including the word line decoding circuit.

FIG. 2 is word line decoding circuits of three common non-volatile memories. FIG. 2(a) shows withstanding the high voltage by making use of inverters I8 and I9 composed of a high-voltage transistor. Inverters I3 and I4 in FIG. 2(b) are of a low-voltage structure; the output terminal of the second inverter I4 is connected serially with a high-voltage NMOS transistor M1, so as to isolate the grid of the high-voltage NMOS transistor M1 and obtain a control voltage higher than the power source voltage via a charge pump or a bootstrap circuit, thus ensuring that high level VC can be transmitted to a word line WLx without loss in read mode; in high voltage mode, the high-voltage NMOS transistor M1 is turned off, isolating the second low-voltage inverter I4, and a negative high voltage VNEG is transmitted to the word line WLx through a high-voltage NMOS transistor M2. FIG. 2(c) and FIG. 2(b) are different only in that isolation is realized by using the NMOS transistor M1 together with a PMOS transistor M3, such that it is not necessary to increase the grid voltage of the NMOS transistor M1 above the power source voltage in read mode. Several high-voltage tubes have to be used in the above-mentioned three circuits. These high-voltage tubes are very big, so as to guarantee the read speed. This will, with area of the device increased inevitably and greatly, not only reduce integration level for the same device area, but also increase circuit complexity and reduce reliability.

CONTENTS OF THE INVENTION

The purpose of the present invention is to provide a decoding circuit withstanding a high voltage via a low-voltage MOS transistor; the decoding circuit has a simple structure and high reliability, and can effectively reduce the area occupied by the device; therefor, the present invention is further to provide a method of implementing the decoding circuit and a memory circuit using the decoding circuit.

In order to achieve the above-mentioned technical purpose, the decoding circuit of the present invention withstanding the high voltage via the low-voltage MOS transistor includes two CMOS inverters connected serially and four switches, the four switches being all provided with one common terminal, two connection terminals and one control terminal;

the substrate of a PMOS transistor MP1 of the first CMOS inverter is connected with the substrate of a PMOS transistor MP2 of the second CMOS inverter and the common terminal of the second switch KA2, whose two connection terminals are power source VCC and ground VSS, respectively;

the source of the PMOS transistor MP1 of the first CMOS inverter is connected with the source of the PMOS transistor MP2 of the second CMOS inverter and the common terminal of the first switch KA1, whose two connection terminals are floating and power source VCC, respectively;

the source and the substrate of an NMOS transistor MN1 of the first CMOS inverter are connected with the common terminal of the third switch KA3, whose two connection terminals are connected with a half negative high voltage and the ground, respectively; and the source and the substrate of an NMOS transistor MN2 of the second CMOS inverter are connected with the common terminal of the fourth switch KA4, whose two connection terminals are connected with a negative high voltage and the ground, respectively.

A memory circuit including the following parts:

A memory cell array; and a decoding circuit as described above, used for decoding an address signal generated by a pre decoder and driving a word line of a memory cell in the memory cell array.

A method is provided to implement the decoding circuit withstanding the negative high voltage via the low-voltage MOS transistor, with N (N≧2) pieces of CMOS inverters being used that are connected sequentially and serially, as shown in FIG. 7; the source of all PMOS transistors in the CMOS inverters is switched to high resistance; the substrate of the PMOS transistor of the first inverter to the ground; the substrate of the PMOS transistor of the second inverter to 1/N-time negative high voltage and so on until the substrate of the PMOS transistor of the N inverter to (N−1)/N-time negative high voltage; the source and the substrate of an NMOS transistor of the first CMOS inverter until that of an NMOS transistor of the Nth CMOS inverter are connected respectively and sequentially with an 1/N-time negative high voltage, a 2/N-time negative high voltage, . . . , an (N−1)/N-time negative high voltage and the negative high voltage; with the input terminal of the first CMOS inverter grounded, output of each of the CMOS inverters is sequentially and respectively the 1/N-time negative high voltage, the 2/N-time negative high voltage, . . . , the (N−1)/N-time negative high voltage and the negative high voltage.

A method is provided to implement the decoding circuit withstanding a positive high voltage via the low-voltage MOS transistor, with N pieces of CMOS inverters connected sequentially and serially, as shown in FIG. 8; the sources of all the NMOS transistors in the CMOS inverters are switched to high resistance; the substrate of the NMOS transistor of the first inverter maintains to the ground VSS; the substrate of the NMOS transistor of the second inverter is switched to 1/N-time positive high voltage; the substrate of the NMOS transistor of the third inverter to 2/N-time positive high voltage and so on until the substrate of the NMOS transistor of the N inverter to (N−1)/N-time positive high voltage; and the sources and substrate of the PMOS transistors in the CMOS inverters are connected respectively and sequentially with 1/N-time positive high voltage, 2/N-time positive high voltage, . . . , (N−1)/N-time positive high voltage and the positive high voltage; and with the input terminal of the first CMOS inverter connected with the ground VSS, the output of each of the CMOS inverters is sequentially and respectively 1/N-time positive high voltage, 2/N-time positive high voltage, . . . , (N−1)/N-time positive high voltage and the positive high voltage.

Through introduction of a central voltage value and switching voltage values of the source and the substrate of the PMOS transistor, the present invention successfully realizes withstanding the high voltage by making use of the low-voltage MOS transistor, realizing in function high-voltage output during a high-voltage operation and fast decoding output during a normal-voltage operation. With a low-voltage tube instead of a high-voltage transistor being used in the circuit, the area the device occupies can effectively be reduced, with area of the high-voltage decoding circuit being reduced by 50%, however the design requirements on function can still be attained. The circuit obtained is also relatively simple with high reliability.

DESCRIPTION OF THE DRAWINGS

The present invention will further be described below in detail with reference to drawings and embodiments.

EMBODIMENTS OF THE INVENTION

Figure 1:
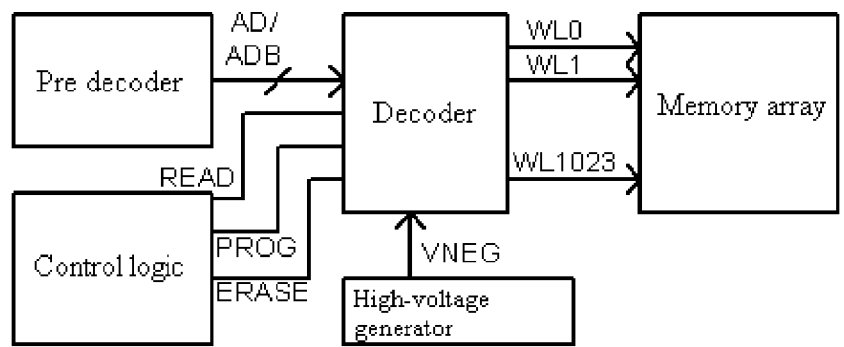
FIG. 1 shows how the decoder is installed in the memory circuit.
Figure 2:
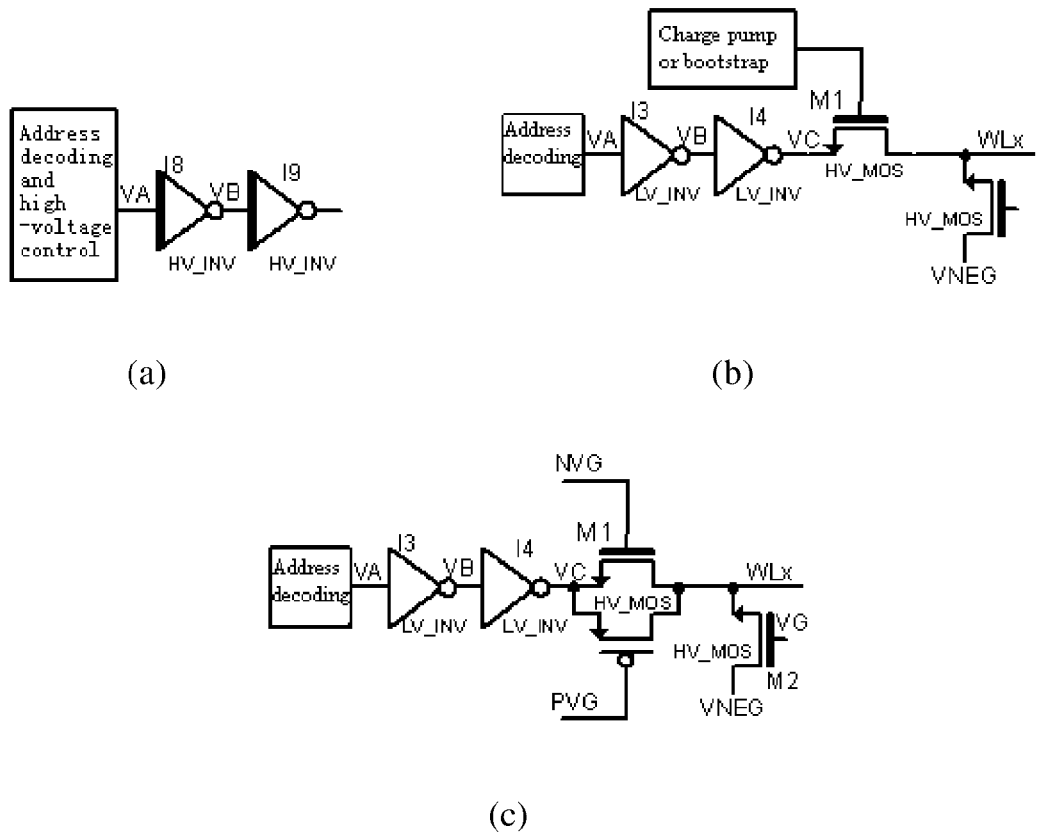
FIG. 2 is a circuit diagram of a common word line decoder.
Figure 3:
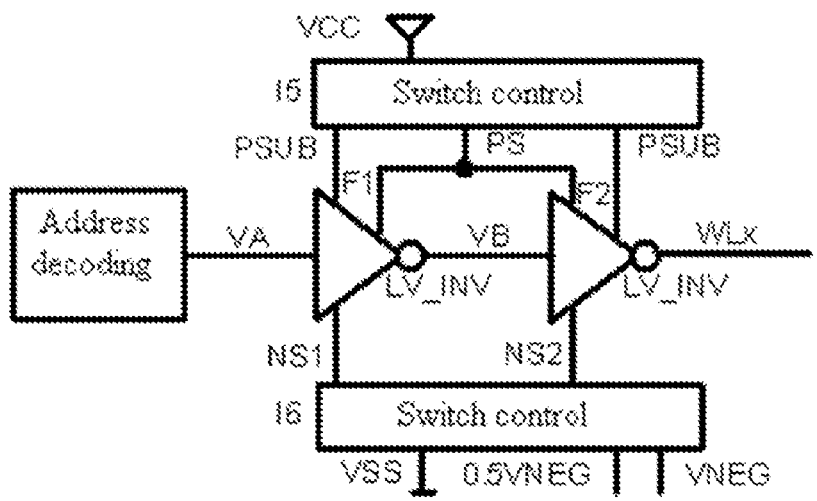
FIG. 3 is an architecture block diagram of an embodiment of the decoding circuit of the present invention.
Figure 4:
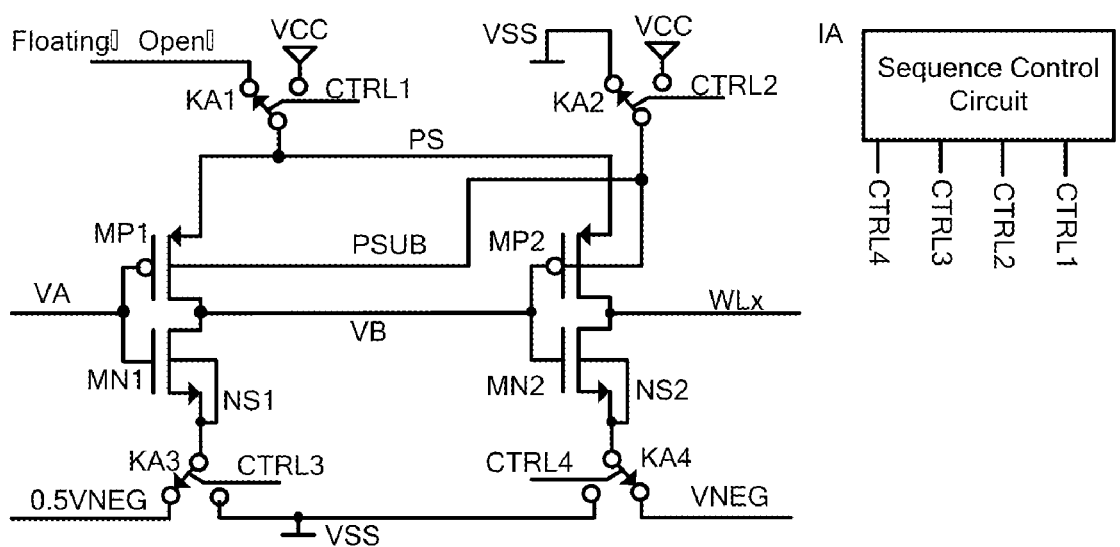
FIG. 4 is a circuit diagram of an embodiment of the decoding circuit of the present invention, where the negative high voltage N=2, VNEG stands for the negative high voltage, and 0.5VNEG stands for the half negative high voltage.

The designer does not hope to use a high-voltage transistor in the circuit, so as to withstand the high voltage in programming mode and obtain fast decoding output in read mode, and reduce area of the device as well. Therefore, the present invention puts forward a solution, in which a decoding circuit is provided to withstand the high voltage by making use of a low-voltage transistor. As shown in FIGS. 3 and 4, the decoding circuit will be specifically described below by taking a circuit as an example, where two CMOS inverters are connected serially, which can withstand a double negative high voltage. The nominal withstand voltage of the transistor here is smaller than 2 V, while target value of the withstand high voltage (including the negative high voltage and the positive high voltage) is ±4 V.

The key point of the technical solution of the present invention is as below: Switch the source and the substrate of the two PMOS transistors in the two-stage CMOS inverter to floating and the ground, respectively, and switch the source and the substrate of the two NMOS transistors in the two-stage CMOS inverter to the half negative high voltage and the negative high voltage, respectively; transmit the half negative high voltage and the negative high voltage to the input terminal and the output terminal of the second-stage inverter via the NMOS transistor in the two-stage CMOS inverter, respectively; consequently, the voltage between source/drain and grid of all the devices, namely the two PMOS transistors and the two NMOS transistors in the two-stage CMOS inverter, is smaller than or equal to one half of the negative high voltage, the relative voltage of each electrode of the low-voltage MOS transistor does not exceed the nominal working voltage, and meanwhile the output word line WLx reaches VNEG, i.e. the target value of the negative high voltage −4 V.

The work process of the circuit shown in FIG. 4 is as below:

During a normal-voltage operation, the circuit can realize fast decoding output like a common decoding circuit.

When changing to a high-voltage operation, first switching the sources of the two PMOS transistors, MP1 and MP2, in the two-stage CMOS inverter from the power source VCC to floating. Then switching the substrates of the two PMOS transistors, MP1 and MP2, in the two-stage CMOS inverter to the ground VSS; in this way, the P-N junction can be prevented from being on that is located from the source to the substrate of the PMOS transistor. Then switching the source and the substrate of the NMOS transistor MN1 in the first CMOS inverter to the terminal of the half negative high voltage 0.5VNEG; before that, first grounding the input terminal VA of the first CMOS inverter, and guaranteeing that the withstand voltage of the first CMOS inverter does not exceed the specified value; in this way, the NMOS transistor MN1 in the first CMOS inverter is on, with its output set to the half negative high voltage. And finally switching the source and the substrate of the NMOS transistor MN2 in the second CMOS inverter to the negative high voltage VNEG; here the input terminal of the second CMOS inverter has already been set to the half negative high voltage, the withstand voltage of the second CMOS inverter does not exceed the specified value, meanwhile the NMOS transistor MN2 in the second CMOS inverter is on, and the negative high voltage VNEG is transmitted to the word line WLx, thus realizing high-voltage output during the high-voltage operation.

When changing to a low-voltage operation, the switching sequence needs to be reversed, with the specific process as below: First switching the source and the substrate of the NMOS transistor MN2 in the second CMOS inverter back to the ground, then switching the source and the substrate of the NMOS transistor MN1 in the first CMOS inverter back to the ground, then switching the substrate of the PMOS transistor, MP1 and MP2, in the two CMOS inverters back to the power source VCC, and finally switching the source of the PMOS transistor, MP1 and MP2, in the two CMOS inverters back to the power source VCC, thus quitting high voltage mode and allowing a high speed read operation.

As shown in FIG. 4, the decoding circuit of the present invention in an embodiment includes two CMOS inverters connected serially and four switches, the four switches being all provided with one common terminal, two connection terminals and one control terminal CTRL1-CTRL4.

The substrate of the PMOS transistor MP1 of the first CMOS inverter is connected with the substrate of the PMOS transistor MP2 of the second CMOS inverter and the common terminal of the second switch KA2, whose two connection terminals are power source VCC and ground VSS, respectively; therefore, the substrate can be switched between VCC and VSS under control of the second switch KA2.

The source of the PMOS transistor MP1 of the first CMOS inverter is connected with the source of the PMOS transistor MP2 of the second-stage CMOS inverter and the common terminal of the first switch KA1, whose two connection terminals are floating and connected with the power source VCC, respectively; therefore, the source can be switched between floating and the power source VCC under control of the first switch KA1.

The source and the substrate of the NMOS transistor MN1 of the first CMOS inverter are connected with the common terminal of the third switch KA3, whose two connection terminals are connected with the half negative high voltage and the ground VSS, respectively; therefore, switching can be performed between the half negative high voltage and the ground VSS under control of the third switch KA3.

The source and the substrate of the NMOS transistor MN2 of the second CMOS inverter are connected with the common terminal of the fourth switch KA4, whose two connection terminals are connected with the negative high voltage and the ground VSS, respectively; therefore, switching can be performed between the negative high voltage and the ground VSS under control of the fourth switch KA4.

Figure 5:
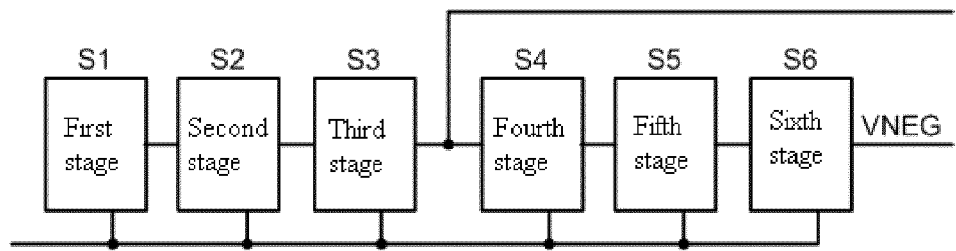
FIG. 5 is a structure diagram of the charge pump generating the negative high voltage VNEG and the half negative high voltage 0.5VNEG.

The half negative high voltage and the negative high voltage are generated by a charge pump circuit. In an embodiment as shown in FIG. 5, the circuit of the charge pump is divided into six stages, which can be selected according to specific requirements on the negative high voltage to be withstood.

The method of implementing the decoding circuit of the present invention withstanding the high voltage via the low-voltage MOS transistor is as below:

Making the relative voltage between the electrodes of the low-voltage MOS transistor still in the required nominal range through a partial-voltage form; while the absolute voltage relative to the ground VSS reaches a double voltage (N=2) or an N-time voltage.

The partial voltage is obtained via the two CMOS inverters connected serially (N=2; and multiple of the voltage is quantity of the inverters). The source of the PMOS transistor in the CMOS inverter is switched to high resistance, i.e. an open-circuit state (Open), and its substrate to the ground. The source of the NMOS transistor MN1 in the first-stage CMOS inverter is connected with the half negative high voltage, and the source of the NMOS transistor MN2 in the second-stage CMOS inverter with the negative high voltage; the input terminal of the first-stage CMOS inverter is grounded, with its output being the half negative high voltage, and output of the second-stage CMOS inverter is the negative high voltage.

Figure 6:
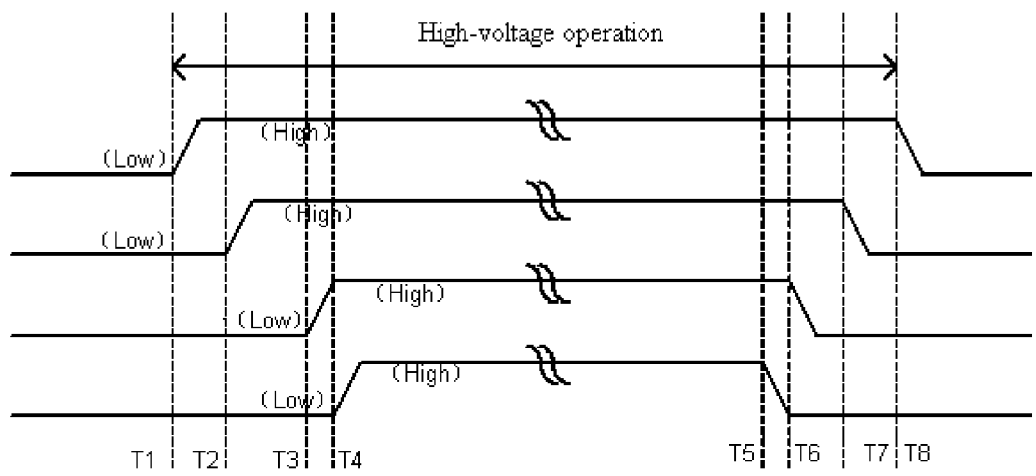
FIG. 6 is a diagram of a sequence that controls the switching sequence.

FIG. 6 shows a control sequence of the sequence generation circuit, which is used for controlling the control terminals of the four switches, so as to perform the corresponding switching. Switching to high voltage mode at a high level, and back to read mode at a low level.

The method of the present invention can be extended to N (N>2) pieces of the CMOS inverters connected serially, where N pieces of the CMOS inverters are needed. The source of all the PMOS transistors in the N pieces of the CMOS inverters is switched to high resistance, the substrate of the PMOS transistor of the first inverter to the ground; the source and substrate of the first NMOS transistor until the Nth NMOS transistor in the N pieces of the CMOS inverters are connected respectively and sequentially with the 1/N-time negative high voltage, the 2/N-time negative high voltage, ..., the (N−1)/N-time negative high voltage and the negative high voltage. With the input terminal of the first CMOS inverter grounded, output of each of the CMOS inverters is sequentially and respectively the 1/N-time negative high voltage, the 2/N-time negative high voltage, ..., the (N−1)/N-time negative high voltage and the negative high voltage. This method enables the low-voltage MOS transistor to withstand the negative high voltage, at the cost of generating an intermediate voltage of the 1/N-time, 2/N-time, ..., (N−1)/N-time negative high voltage, respectively, with the high voltage still smaller than the breakdown voltage of the P-N junction composed of the drain and the substrate of the PMOS transistor.

The switching is preformed according to the following sequence rules:

While boosting the voltage, first switching the source of the PMOS transistor in each of the CMOS inverters, and then switching the substrate of the PMOS transistor; and then switching sequentially and respectively from front to rear the source of the NMOS transistor in each of the CMOS inverters to the 1/N-time negative high voltage, the 2/N-time negative high voltage, ..., the (N−1)/N-time negative high voltage and the negative high voltage; and while reducing and recovering the voltage, first switching sequentially and respectively from rear to front the source of the NMOS transistor in each of the CMOS inverters back to the ground, then switching the substrate of the PMOS transistor in each of the CMOS inverters back to the power source, and finally switching the source of the PMOS transistor in each of the CMOS inverters back to the power source.

For any of the CMOS inverters, the voltage between the grid and the source, the grid and the drain, or the grid and the substrate of its PMOS transistor does not exceed the 1/N-time negative high voltage; and for any of the CMOS inverters, the voltage between the grid and the source, the grid and the drain, or the grid and the substrate of its NMOS transistor does not exceed the 1/N-time negative high voltage.

Switching of the substrate and the source of the NMOS transistor and the PMOS transistor in each of the CMOS inverters follows a sequence generated by the sequence generation circuit, thus avoiding the possible latch-up effect resulted from the substrate switching.

The method of the present invention can also be extended to a positive high voltage by making the above setting be a P/N dual; that is, the sources of all the NMOS transistors in the CMOS inverters are switched to high resistance; the substrate of the NMOS transistor of the first inverter maintain to the ground VSS; and the sources and substrate of the PMOS transistors in the CMOS inverters are connected respectively and sequentially with 1/N-time positive high voltage, 2/N-time positive high voltage, ..., (N−1)/N-time positive high voltage and the positive high voltage; and with the input terminal of the first CMOS inverter connected with the ground VSS, the output of each of the CMOS inverters is sequentially and respectively 1/N-time positive high voltage, 2/N-time positive high voltage, ..., (N−1)/N-time positive high voltage and the positive high voltage. This method enables the low-voltage MOS transistor to withstand the positive high voltage.

The 1/N-time to (N−1)/N-time negative high voltage and the negative high voltage are generated by a negative charge pump, and the 1/N-time to (N−1)/N-time positive high voltage and the positive high voltage by a positive charge pump.

The switching is performed according to the following sequence rules:

While boosting the voltage, first switching the substrate of the NMOS transistor in each of the CMOS inverters, and then switching the source of the NMOS transistor; and then switching sequentially and respectively from front to rear the source of the PMOS transistor in each of the CMOS inverters to 1/N-time positive high voltage, 2/N-time positive high voltage, ..., (N−1)/N-time positive high voltage and the positive high voltage; and while reducing and recovering the voltage, first switching sequentially from rear to front the source of the PMOS transistor in each of the CMOS inverters back to the power source, then switching the substrate of the NMOS transistor in each of the CMOS inverters back to the ground, and finally switching the source of the NMOS transistor in each of the CMOS inverters back to the ground.

For any of the CMOS inverters, the voltage between the grid and the source, the grid and the drain, or the grid and the substrate of its PMOS transistor does not exceed the 1/N-time positive high voltage; and for any of the CMOS inverters, the voltage between the grid and the source, the grid and the drain, or the grid and the substrate of its NMOS transistor does not exceed the 1/N-time positive high voltage.

Switching of the substrate and the source of the NMOS transistor and the PMOS transistor in each of the CMOS inverters follows a sequence generated by the sequence generation circuit, thus avoiding the possible latch-up effect resulted from the substrate switching.

In the circuit as shown in FIG. 3 and FIG. 4, the negative high voltage N=2; and each nodal voltage value in different modes is shown in the following table:

| Mode | Source of PMOS | Substrate of PMOS (VPB) | Input of First-stage Inverter (VA) | Source of First-stage NMOS | Source of Second-stage NMOS | Output of First-stage Inverter | Output of Second-stage Inverter |
|---|---|---|---|---|---|---|---|
| High Voltage | Open | VSS | VSS | 0.5 * VNEG | VNEG | 0.5 * VNEG | VNEG |
| Read | VCC | VCC | Input | VSS | VSS | /Input | Input |

In the table,
VSS stands for the ground,
VCC the power supply voltage,
VNEG the high voltage,
Input the logic input level,
/Input the logical NOT of Input, and
Open (floating) the high resistance state.

In the table, VSS stands for the ground, VCC the power source voltage, VNEG the negative high voltage, Input the logic input level, /Input the logical NOT of Input, and Open (floating) the high resistance state.

The decoding circuit of the present invention can be applied in a memory circuit, which includes a memory cell array and a decoding circuit as described above as well, the decoding circuit decoding an address signal generated by a pre decoder and driving a word line of a memory cell in the memory cell array. In programming (PROG) mode, with input of the first CMOS inverter being the ground, the substrate of the PMOS transistor in the two CMOS inverters is switched to the ground from the power source, and the source to floating (Open) from the power source; the substrate and the source of the NMOS transistor in the first CMOS inverter are switched to the half negative high voltage from the ground, and the substrate and the source of the NMOS transistor in the second CMOS inverter are switched to the negative high voltage, such that output of the second CMOS inverter, i.e. word line output of the decoder, is the negative high voltage. Switching between the substrate and source of the NMOS transistor and the PMOS transistor in each of the CMOS inverters is performed by the four switches, whose control terminal is controlled by the sequence generation circuit.

The present invention is described in detail above with reference to the embodiment, which however does not restrict the present invention. Those skilled in the art can, without deviating from principle of the present invention, further make some deformation and improvement, which should also be regarded as within the extent of protection of the present invention.

What is claimed is:

1. A decoding circuit withstanding a high voltage via a low-voltage MOS transistor, the decoding circuit comprising two CMOS inverters connected serially; wherein the decoding circuit further includes four switches, all being provided with one common terminal, two connection terminals and one control terminal;

the substrate of a PMOS transistor (MP1) of the first CMOS inverter is connected with the substrate of a PMOS transistor (MP2) of the second CMOS inverter and the common terminal of the second switch (KA2), whose two connection terminals are power source VCC and ground VSS, respectively;

the source of the PMOS transistor (MP1) of the first CMOS inverter is connected with the source of the PMOS transistor (MP2) of the second CMOS inverter and the common terminal of the first switch (KA1), whose two connection terminals are floating and power source VCC, respectively;

the source and the substrate of an NMOS transistor (MN1) of the first CMOS inverter are connected with the common terminal of the third switch (KA3), whose two connection terminals are connected with a half negative high voltage and the ground, respectively; and the source and the substrate of an NMOS transistor (MN2) of the second CMOS inverter are connected with the common terminal of the fourth switch (KA4), whose two connection terminals are connected with the negative high voltage and the ground, respectively.

2. The decoding circuit withstanding the high voltage via the low-voltage MOS transistor according to claim 1, wherein the decoding circuit further includes a sequence generation circuit for controlling the control terminals of the four switches.

3. The decoding circuit withstanding the high voltage via the low-voltage MOS transistor according to claim 1, wherein the half negative high voltage and the negative high voltage are generated by a charge pump circuit.

4. A memory circuit comprising
a memory cell array;
wherein the memory circuit further includes the decoding circuit according to claim 1, which decodes an address signal generated by a pre decoder and drives a word line of a memory cell in the memory cell array.

5. The memory circuit according to claim 4, wherein in programming mode, with input of the first CMOS inverter being the ground, the substrate of the PMOS transistor in the two CMOS inverters is switched to the ground and the source to floating from the power source; the substrate and the source of the NMOS transistor in the first CMOS inverter are switched to the half negative high voltage from the ground, and the substrate and the source of the NMOS transistor in the second CMOS inverter are switched to the negative high voltage, with output of the second CMOS inverter, i.e. word line output of a decoder, being the negative high voltage.

6. The memory circuit according to claim 4, wherein the control terminal of the four switches is controlled by the sequence generation circuit.

* * * * *